(12) United States Patent
Takyu et al.

(10) Patent No.: US 7,135,384 B2
(45) Date of Patent: Nov. 14, 2006

(54) SEMICONDUCTOR WAFER DIVIDING METHOD AND APPARATUS

(75) Inventors: Shinya Takyu, Kitakatsushika-gun (JP); Ninao Sato, Mitaka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 113 days.

(21) Appl. No.: 10/787,207

(22) Filed: Feb. 27, 2004

(65) Prior Publication Data

US 2004/0224483 A1 Nov. 11, 2004

(30) Foreign Application Priority Data

Feb. 28, 2003 (JP) .............................. 2003-054688

(51) Int. Cl.
*H01L 21/46* (2006.01)
(52) U.S. Cl. .................... 438/460; 438/113; 438/462; 438/463
(58) Field of Classification Search ................ 438/68, 438/113, 114, 458, 459, 460, 462, 463, 464, 438/465
See application file for complete search history.

(56) References Cited

U.S. PATENT DOCUMENTS

| | | | |
|---|---|---|---|
| 5,888,883 A | 3/1999 | Sasaki et al. | |
| 6,184,109 B1 | 2/2001 | Sasaki et al. | |
| 6,294,439 B1 | 9/2001 | Sasaki et al. | |
| 6,337,258 B1 | 1/2002 | Nakayoshi et al. | |
| 6,407,360 B1 | 6/2002 | Choo et al. | |
| 6,465,330 B1 | 10/2002 | Takahashi et al. | |
| 6,562,698 B1 | 5/2003 | Manor | |
| 6,590,181 B1 | 7/2003 | Choo et al. | |
| 6,756,562 B1 | 6/2004 | Kurosawa et al. | |
| 2005/0003633 A1* | 1/2005 | Mahle et al. | 438/463 |

FOREIGN PATENT DOCUMENTS

| | | |
|---|---|---|
| CN | 1340855 A | 3/2002 |
| JP | 61-112345 | 5/1986 |
| JP | 63-293939 | 11/1988 |
| JP | 2001-144037 | 5/2001 |
| JP | 2002 75921 A | 3/2002 |

OTHER PUBLICATIONS

Iljima, T. et al., "Semiconductor Device Obtained by Dividing Semiconductor Wafer by Use of Lase Dicing Technique and Method of Manufacturing the Same", U.S. Appl. No. 10/418,274, filed Apr. 18, 2003.
Official Action from the State Intellectual Property Office of the People's Republic of China dated Sep. 16, 2005, and English language translation of same.

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

A semiconductor element is formed in a semiconductor wafer, and a groove is formed by performing half-cut dicing on the semiconductor wafer along a dicing line. A dicing region of the semiconductor wafer is irradiated with a laser beam to melt or vaporize a cutting streak formed by dicing. An adhesive tape is adhered to the semiconductor element formation surface of the semiconductor wafer, and the other side of the semiconductor element formation surface is ground to at least a depth reaching the groove.

16 Claims, 6 Drawing Sheets

SEMICONDUCTOR WAFER DIVIDING METHOD AND APPARATUS

CROSS-REFERENCE TO RELATED APPLICATIONS

This application is based upon and claims the benefit of priority from prior Japanese Patent Application No. 2003-054688, filed Feb. 28, 2003, the entire contents of which are incorporated herein by reference.

BACKGROUND OF THE INVENTION

1. Field of the Invention

The present invention relates to a method of manufacturing a semiconductor device and an apparatus for manufacturing a semiconductor device and, more particularly, to a dicing step and dicing apparatus for forming semiconductor chips by dividing a semiconductor wafer.

2. Description of the Related Art

Conventionally, a dicing step in the semiconductor device manufacturing process is performed as shown in FIGS. 1A, 1B, and 1C. That is, as shown in FIGS. 1A and 1B, a semiconductor wafer 11 in which elements are formed is cut one way along dicing lines 12-1, 12-2, . . . , by using a diamond blade (rotating blade) 13. The wafer 11 is then rotated 90° and, as shown in FIG. 1C, diced again in a direction perpendicular to the former dicing direction. In this manner, the wafer 11 is divided into individual semiconductor chips 14-1, 14-2, 14-3, . . . .

The above dicing step can be performed by either a full-cut method by which the wafer 11 is completely cut, or a half-cut method by which the wafer 11 is diced to about ½ the thickness of the wafer 11 or to a depth with which the wafer 11 remains by about 30 µm.

The half-cut method requires a dividing operation after dicing; the wafer 11 is sandwiched between flexible films or the like and divided by applying an external force by rollers. When an adhesive sheet is adhered before dicing, the wafer 11 is divided via the sheet by applying an external force by rollers or the like.

In a die bonding step, each of the chips 14-1, 14-2, 14-3, . . . , of the divided wafer 11 is mounted on a lead frame. More specifically, the lower surface of the adhesive sheet of each of the chips 14-1, 14-2, 14-3, . . . , is pushed up by a pickup needle, and the needle is brought into direct contact with the back surface of each chip through the adhesive sheet. Each chip is further raised and removed from the adhesive sheet. The removed chip is conveyed as its upper surface is held by suction by a tool called a collet, and mounted on a die pad of the lead frame.

Subsequently, a wire bonding step is performed to electrically connect pads of the chips 14-1, 14-2, 14-3, . . . , to inner leads of the lead frame. When the chips are to be mounted on a TAB tape, a heated bonding tool is used to electrically connect pads of these chips to leads of the TAB tape.

After that, a packaging step is performed to encapsulate each chip in a resin or ceramic package, thereby completing a semiconductor device.

In the dicing step of the manufacturing method as described above, however, strain or chipping occurs on the side surface of each semiconductor chip owing to cutting streaks, and this lowers the bending strength of the chip. Therefore, if stress is applied which is produced by the pressure applied in the pickup step performed before the step of mounting the chip on the lead frame or TAB tape, or by the difference between the thermal expansion coefficients of the packaging material and chip, this stress concentrates to the strain or chipping, so the chip cracks from this strain or chipping.

Recently, to embed a semiconductor chip in a thin card-like package or the like, a manufacturing method is used by which when a semiconductor wafer is cut, the backside of the pattern formation surface (semiconductor element formation surface) of the wafer is thinned by grinding using a wheel or by polishing using free abrasive grains, and then the wafer is cut by dicing. Also, a technique called DBG (Dicing Before Grinding) is proposed to form thinner chips (e.g., Jpn. Pat. Appln. KOKAI Publication No. S61-112345). In this DBG, a cut (half cut) is formed to a predetermined depth from the element formation surface of a wafer, and the back surface of the wafer is ground to divide the individual chips and decrease the thickness at the same time.

By this technique, chipping on the back surface or on an edge between the side surface and back surface of a chip can be removed by polishing the back surface of a semiconductor wafer. However, strain or chipping caused by cutting streaks formed on the side surface of a semiconductor chip cannot be removed. This inevitably lowers the bending strength when the thickness of a chip is decreased. Consequently, it is impossible to completely solve the problem that semiconductor chips crack in the assembly steps or in the reliability test before they are packaged, and defective products are formed.

In recent years, therefore, a technique which cuts a semiconductor wafer by laser beam irradiation, instead of dicing using mechanical cutting as described above, is attracting attention (e.g., Jpn. Pat. Appln. KOKAI Publication No. 2001-144037). This cutting using laser beam irradiation can eliminate streaks or chipping by mechanical cutting. However, a laser beam requires high power, so the side surface of a chip is damaged or roughened by recrystallization after melting. This inevitably lowers the bending strength. Also, a material melted by laser beam irradiation scatters and contaminates the surface of a chip. Furthermore, when a semiconductor wafer is to be cut via an adhesive sheet, the wafer must be irradiated with a laser beam twice by changing the focusing position (in the direction of depth of the wafer) of the laser beam. This complicates the dicing step.

BRIEF SUMMARY OF THE INVENTION

According to an aspect of the present invention, there is provided a method of manufacturing a semi-conductor device comprising forming a semiconductor element in a semiconductor wafer, forming a groove by performing half-cut dicing on the semiconductor wafer along a dicing line, irradiating a dicing region of the semiconductor wafer with a laser beam to melt or vaporize a cutting streak formed by dicing, adhering an adhesive tape to a semiconductor element formation surface of the semiconductor wafer, and grinding a backside of the semiconductor element formation surface to at least a depth reaching the groove.

According to another aspect of the present invention, there is provided a method of manufacturing a semiconductor device comprising forming a semi-conductor element in a semiconductor wafer, forming a groove by performing half-cut dicing on the semi-conductor wafer along a dicing line, adhering an adhesive tape to a semiconductor element formation surface of the semiconductor wafer, grinding a backside of the semiconductor element formation surface to at least a depth reaching the groove, and irradiating a dicing region of a semiconductor chip, formed by dividing the semiconductor wafer in the grinding step, with a laser beam, thereby melting or vaporizing a cutting streak formed by dicing.

According to still another aspect of the present invention, there is provided an apparatus for manufacturing a semiconductor device comprising a dicer which forms a groove by performing half-cut dicing on a semiconductor wafer along a dicing line, a tape adhering apparatus which adheres an adhesive tape to a semiconductor element formation surface of the semiconductor wafer, a grinding apparatus which grinds a backside of the semiconductor element formation surface of the semiconductor wafer to at least a depth reaching the groove formed by the half-cut dicing, and a laser emitting apparatus which moves an irradiation position of a laser beam in accordance with a dicing position of the dicer, and melts or vaporizes a cutting streak formed in a dicing region of the semiconductor wafer.

DETAILED DESCRIPTION OF THE INVENTION

[First Embodiment]

Figure 1A:
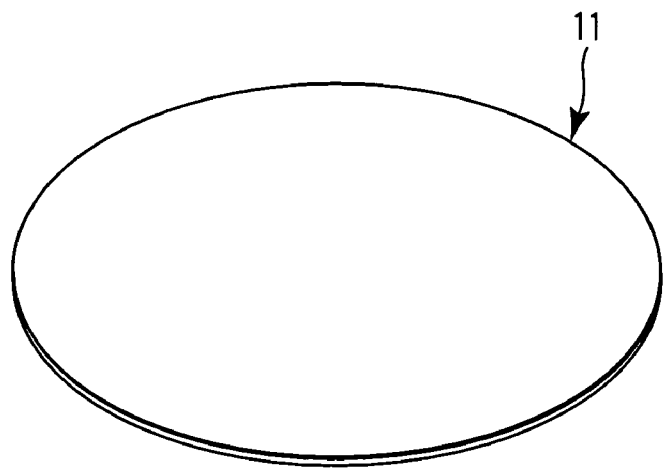
FIGS. 1A, 1B, and 1C are perspective views, showing a dicing step and dicing apparatus for forming individual semiconductor chips by dividing a semiconductor wafer, for explaining a conventional semiconductor device manufacturing method and semiconductor device manufacturing apparatus.
Figure 1B:
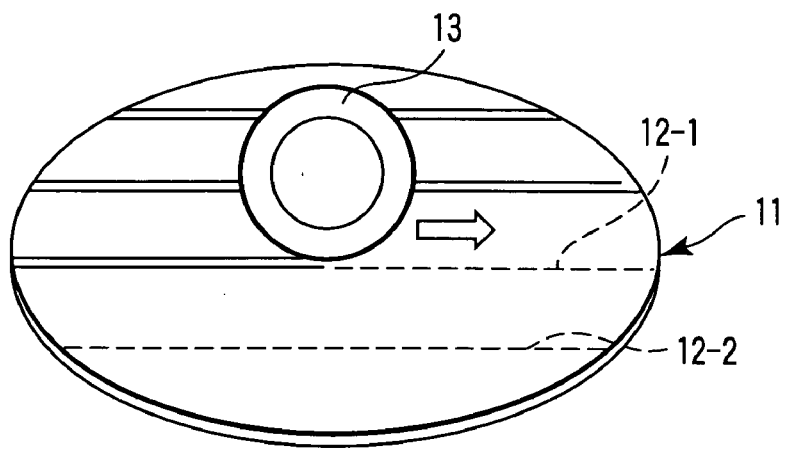
Figure 1C:
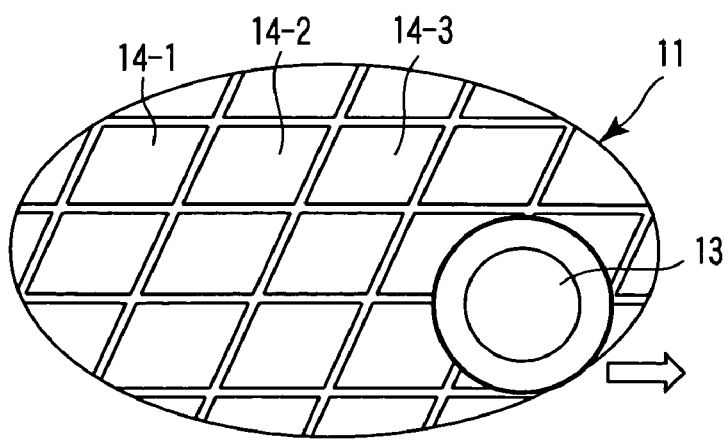
Figure 2:
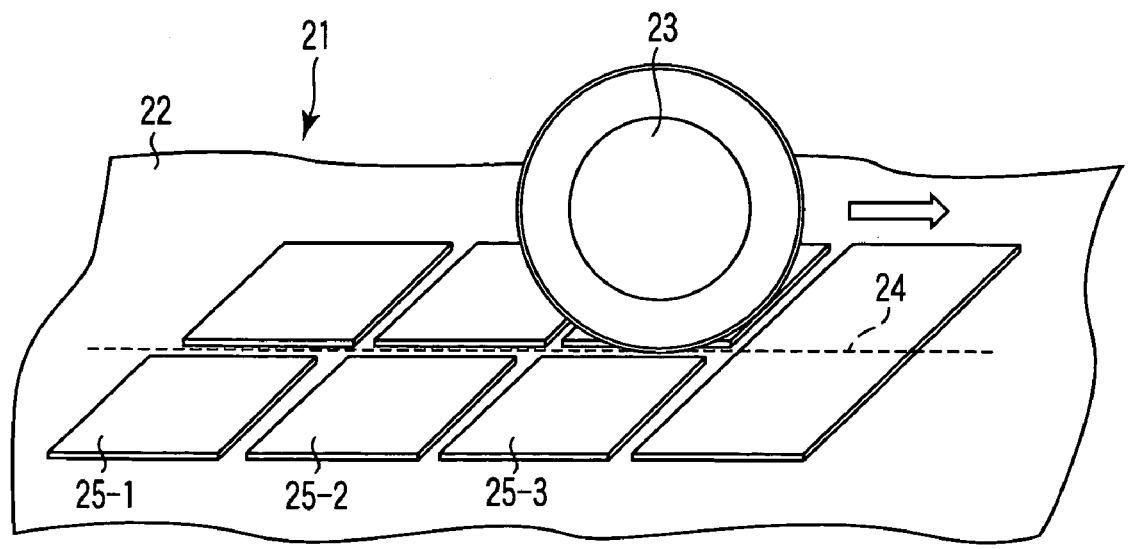
FIG. 2 is a perspective view, showing a dicing step, for explaining a semiconductor device manufacturing method and semiconductor device manufacturing apparatus according to the first embodiment of the present invention.
Figure 3:
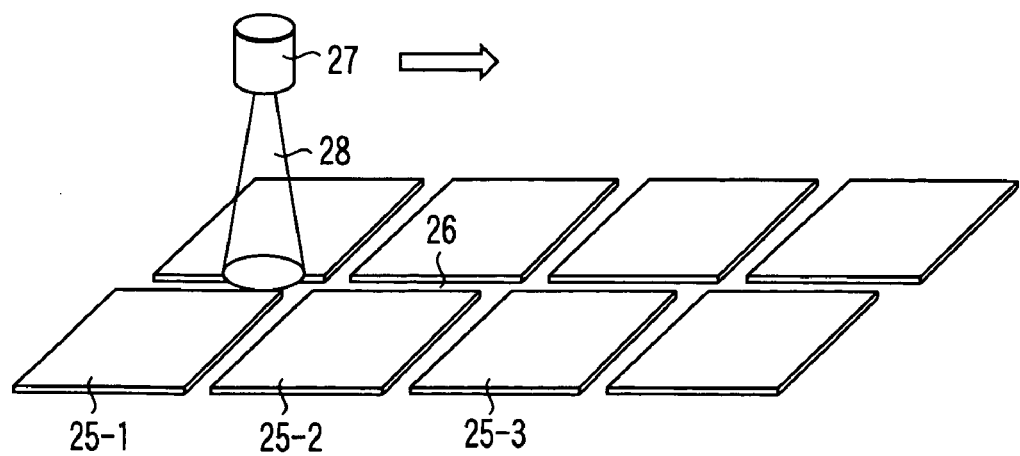
FIG. 3 is a perspective view, showing a step of processing the side surfaces of chips by laser beam irradiation, for explaining the semiconductor device manufacturing method and semiconductor device manufacturing apparatus according to the first embodiment of the present invention.

FIGS. 2 and 3 are views for explaining a semiconductor device manufacturing method and semiconductor device manufacturing apparatus according to the first embodiment of the present invention. FIG. 2 shows a dicing step, and FIG. 3 shows a step of processing a dicing region by irradiating the dicing region with a laser beam.

First, various semiconductor elements are formed in a semiconductor wafer 21 by known manufacturing process.

Next, a sheet adhering apparatus is used to adhere an adhesive sheet 22 to the backside of the element formation surface of the semiconductor wafer 21 in which the elements are formed. The adhesive sheet 22 is fixed to a dicing table by suction. The major surface of the semiconductor wafer 21 is then diced into individual semiconductor chips 25-1, 25-2, 25-3, . . . , along a dicing line 24 by using a dicer (e.g., a diamond blade 23).

After that, as shown in FIG. 3, a dicing region 26 formed by the diamond blade 23 is irradiated with a laser beam 28 from a laser emitting apparatus 27, thereby melting or vaporizing the chip side surfaces in the dicing region 26. The laser emitting apparatus 27 moves in a direction indicated by the arrow, and irradiates the dicing region 26 with the laser beam 28.

As the laser emitting apparatus 27, it is possible to use, e.g., a YAG-THG laser, YVO4 laser, or $CO_2$ laser. When an experiment was conducted by using the YAG-THG laser (wavelength 355 nm) at a Qsw frequency of 50 KHz, an average output of about 1.5 W, a melting diameter of about 15 μm, and a scanning rate (moving velocity) of 5 mm/sec, it was possible to melt or vaporize the cut surface and well remove strain or chipping caused by cutting streaks. In experiments conducted under different conditions, effects were obtained when the wavelength, average output, and scanning rate of the laser beam 28 were 266 to 1,064 nm, 0.8 to 4.5 W, and 1 to 400 mm/sec, respectively. If the laser beam output is small and the scanning rate is high, the cut surface melts and recrystallizes. If the laser beam output is large and the scanning rate is low, the cut surface vaporizes. If the laser beam wavelength is short, the cutting quality of the beam becomes sharp to readily cause damages. Preferably, the laser beam has a frequency ranging from 50 to 200 KHz. More preferably, the laser beam should have a frequency ranging from 100 to 200 KHz, to make the side surfaces of each semi-conductor chip more flat. The surface condition can be optimized by setting the various conditions such as the wavelength, frequency, average output, and scanning rate of the laser beam 28 in accordance with the size, thickness, and the like of the semiconductor wafer or chip.

Steps after that are the same as the well-known semiconductor device manufacturing method. That is, a dicing step is performed to mount each of the chips 25-1, 25-2, 25-3, . . . , on a lead frame. More specifically, the lower surface of the adhesive sheet 22 of each of the chips 25-1, 25-2, 25-3, . . . , is pushed up by a pickup needle, and the needle is brought into direct contact with the back surface of the chip through the adhesive sheet 22 (although the pickup needle need not always extend through the adhesive sheet 22). Then, each chip is further raised and removed from the adhesive sheet 22. The removed chip is conveyed as its upper surface is held by suction by a collet, and mounted on a die pad of the lead frame.

Subsequently, a wire bonding step is performed to electrically connect pads of the chip to inner leads of the lead frame. When the chips 15-1, 15-2, 15-3, . . . , are to be mounted on a TAB tape, a heated bonding tool is used to electrically connect pads of these chips to leads of the TAB tape.

After that, a packaging step is performed to encapsulate each chip in a resin or ceramic package, thereby completing a semiconductor device.

In the manufacturing method as described above, the dicing region 26 of the semiconductor chips 25-1, 25-2, 25-3, . . . , is melted or vaporized as it is irradiated with the laser beam 28. This makes it possible to remove strain or chipping caused by cutting streaks formed on the side surface of each semi-conductor chip, and increase the bending strength of the chip. Therefore, it is possible to eliminate defective products resulting from cracking of the semiconductor chips in the assembly steps (the pickup step, mounting step and resin encapsulation step) or in the reliability test before the semiconductor chips are packaged. In addition, contamination on the chip surface by adhesion of the evaporated material can be reduced compared to dicing performed by laser beam irradiation.

Figure 4A:
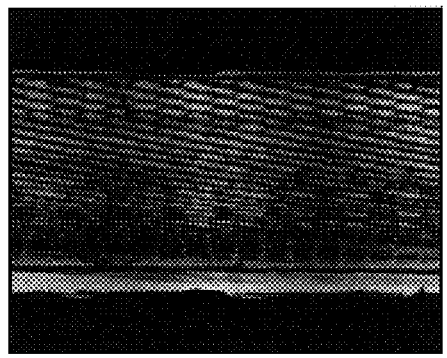
FIGS. 4A and 4B are microphotographs for comparing the side surfaces of semiconductor chips formed by the semiconductor device manufacturing methods and semiconductor device manufacturing apparatuses according to the prior art and the first embodiment of the present invention.
Figure 4B:
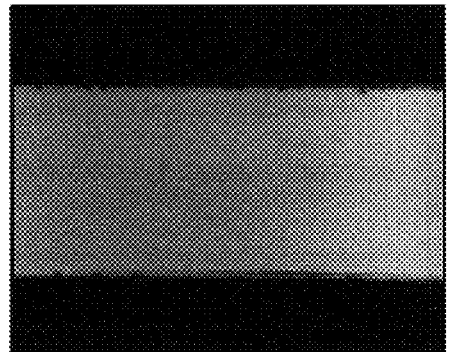

FIG. 4A is a microphotograph of the side surface of a semiconductor chip formed by the conventional manufacturing method and manufacturing apparatus. FIG. 4B is a microphotograph of the side surface of a semiconductor chip formed by the manufacturing method and manufacturing apparatus of this embodiment. As is apparent from the comparison of FIGS. 4A and 4B, a large number of cutting streaks formed by dicing are present on the side surface of the semiconductor chip formed by the conventional manufacturing method and manufacturing apparatus. In contrast, the side surface of the semiconductor chip whose surface is processed by the laser beam is smooth. Accordingly, stress concentration hardly occurs, so the bending strength of the chip can be increased. Consequently, it is possible to prevent defects such as cracks of semiconductor chips in the pickup step, mounting step resin encapsulation step, reliability test, and the like. It is also possible to suppress a decrease in chip bending strength caused by dicing.

Second Embodiment

In the first embodiment described above, the semiconductor wafer 21 is fully cut by dicing. However, the present invention is also applicable to a manufacturing step (DBG) in which grooves are formed by half-cutting the semiconductor wafer 21, and the semiconductor wafer 21 is divided by grinding its back surface.

That is, after various semiconductor elements are formed in a semiconductor wafer 21 by known manufacturing steps, the major surface of the semi-conductor wafer 21 is diced along a dicing line and chip dividing lines to form half-cut grooves. A diamond blade 23 as shown in FIG. 2 is used to form these half-cut grooves. The depth of the cut is larger by about 10 to 30 μm (at least 5 μm) than the final thickness of a chip. This difference is determined by the accuracy of the dicer and grinder.

After that, as shown in FIG. 3, a dicing region 26 formed by the diamond blade 23 is irradiated with a laser beam 28 from a laser emitting apparatus 27, thereby melting or vaporizing the chip side surfaces in the dicing region 26. The laser emitting apparatus 27 moves in a direction indicated by the arrow, and irradiates the dicing region 26 with the laser beam 28.

Subsequently, a sheet adhesion apparatus is used to adhere an adhesive sheet (surface protection tape) on the element formation surface of the semiconductor wafer 21 having undergone the half-cut dicing and the surface processing using the laser beam. This surface protection tape prevents damage to the elements during the course of grinding and thinning the back surface of the wafer.

Then, the back surface of the wafer 21 is ground. In this back surface grinding step, the wafer back surface is ground to a predetermined thickness by rotating a wheel having a whetstone at a high speed of 4,000 to 7,000 rpm. The whetstone is obtained by binding artificial diamond with a resin and molding the resultant material. This back surface grinding step is often performed in a biaxial manner. It is also possible to first roughly grind the surface uniaxially with a whetstone of No. 320 to 600, and then finely grind the surface biaxially with a whetstone of No. 1500 to 2000. A triaxial grinding method is also possible. When grinding reaches the grooves, the semiconductor wafer 21 is divided into individual semiconductor chips 25-1, 25-2, 25-3, . . . . Even after the semiconductor wafer 21 is thus divided, back surface grinding is continued to obtain a predetermined thickness. As a consequence, chipping formed in the intersection of the side surface and back surface of each semiconductor chip can be removed.

Subsequently, the back surface of each semiconductor chip is planarized by mirror polishing, e.g., wet etching using a wet etching apparatus, plasma etching using a plasma etching apparatus, polishing using a polishing apparatus, buffing using a buffing apparatus, or CMP (Chemical Mechanical Polishing) using a CMP apparatus. Since cutting streaks formed by the back surface grinding can be removed by this planarization, the bending strength can be further increased.

Steps after that are the same as the well-known semiconductor device manufacturing method. That is, a semiconductor device is completed through packaging steps such as a step of picking up each semiconductor chip, a step of mounting the chip on a lead frame or TAB tape, and a step of encapsulating the chip into a package.

In the manufacturing method as described above, the dicing region 26 of the semiconductor chips 25-1, 25-2, 25-3, . . . , is melted or vaporized as it is irradiated with the laser beam 28. This makes it possible to remove strain or chipping caused by cutting streaks formed on the side surface of each semi-conductor chip, and increase the bending strength of the chip. Therefore, it is possible to eliminate defective products resulting from cracking of the semiconductor chips in the assembly steps (the pickup step, mounting step and resin encapsulation step) or in the reliability test before the semiconductor chips are packaged. Also, a decrease in chip bending strength caused by dicing can be suppressed. In addition, contamination on the chip surface by adhesion of the evaporated material can be reduced compared to dicing performed by laser beam irradiation.

In the above second embodiment, the dicing region is irradiated with the laser beam before the back surface grinding step. However, the side surface (dicing region) of each semiconductor chip formed by dividing the semiconductor wafer after the back surface grinding step may also be irradiated with the laser beam.

Figure 5:
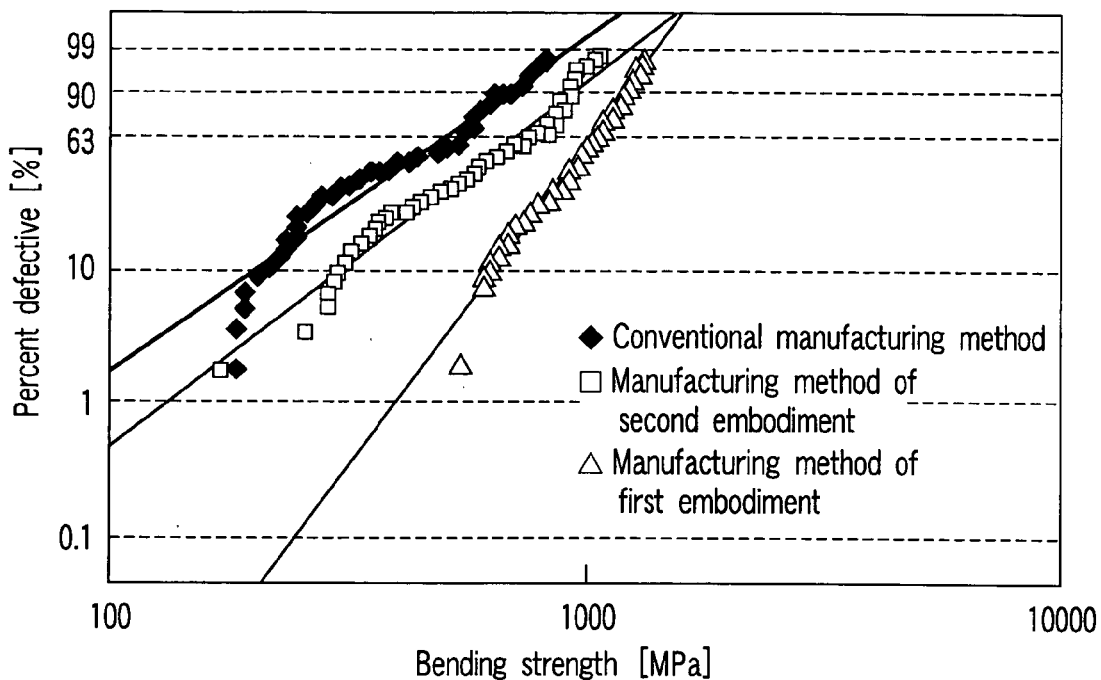
FIG. 5 is a graph showing the relationship between the chip bending strength and the percent defective by comparing semiconductor chips formed by the semiconductor device manufacturing methods and semiconductor device manufacturing apparatuses according to the prior art and the first and second embodiments of the present invention.

FIG. 5 is a graph, showing the relationship between the chip bending strength [MPa] and the percent defective [%], for comparing the conventional manufacturing method and manufacturing apparatus with the semiconductor device manufacturing methods according to the first and second embodiments of the present invention. Symbols ◇, □, and Δ plot the chip bending strength [MPa] as a function of the percent defective [%] of the conventional manufacturing method, that of the manufacturing method according to the second embodiment of the present invention, and that of the manufacturing method according to the first embodiment of the present invention, respectively.

In the semiconductor device manufacturing method according to the first embodiment of the present invention, the bending strength greatly rises, and the percent defective decreases accordingly. In the semiconductor device manufacturing method according to the second embodiment, the bending strength decreases because the chips are thin. However, this bending strength is still higher than that of the conventional manufacturing method, and the percent defective is lower than that of the conventional manufacturing method. Accordingly, it is possible to eliminate defective products resulting from cracking of the semiconductor chips in the assembly steps (the pickup step, mounting step and resin encapsulation step) or in the reliability test before the semiconductor chips are packaged.

Figure 6A:
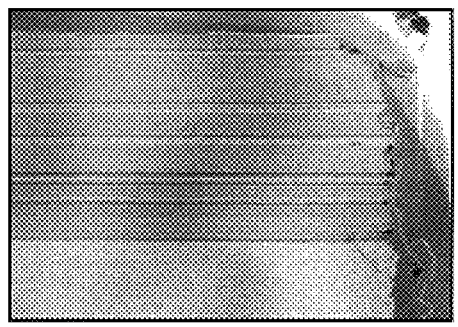
FIGS. 6A and 6B are microphotographs showing the side surface of a semiconductor chip having undergone blade dicing, and the side surface of a semiconductor chip after TCT is repeated 500 times.
Figure 6B:
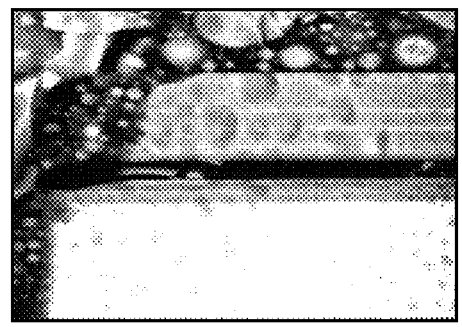

The semiconductor device manufacturing methods and semiconductor device manufacturing apparatuses according to the first and second embodiments also effectively prevent peeling of a low-dielectric-constant film called a Low-K film when the film is used as a dielectric interlayer. That is, when this Low-K film is used as an interlayer dielectric film, cracking occurs during blade dicing whether the full-cut method or half-cut method is used, so peeling occurs in TCT (Temperature Cycling Test). FIG. 6A is a micro-photograph of the side surface of a semiconductor chip having undergone blade dicing. FIG. 6B is a microphotograph of the side surface of a semiconductor chip when TCT is repeated 500 times. Even though the cut surface is relatively good upon dicing as shown in FIG. 6A, fine cracks are formed, because Low-K films are used, on the substrate and between the Low-K films by thermal stress. These cracks cause peeling of the Low-K films.

Figure 7A:
FIGS. 7A and 7B are microphotographs showing the side surface of a semiconductor chip having undergone laser dicing, and the side surface of a semiconductor chip after TCT is repeated 500 times.
Figure 7B:
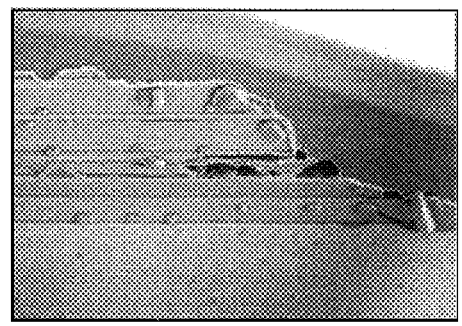
Figure 8:
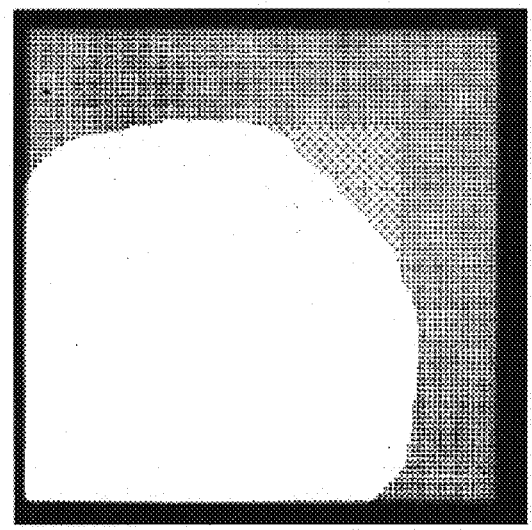
FIG. 8 is a microphotograph showing the result of FIB measurement of a laser-diced semiconductor chip.

In contrast, the cut surface obtained by laser dicing was good as shown in FIG. 7A, and no serious abnormality was found as shown in FIG. 7B even after TCT was repeated 500 times. Also, no particular abnormality was detected by SAT (Scanning Acoustic Topography) measurement. However, when FIB (Focused Ion Beam) measurement was performed, peeling by destruction of a Low-K film was found. Referring to FIG. 8, peeling occurs in a white portion from the lower left corner to the vicinity of the center.

Figure 9:
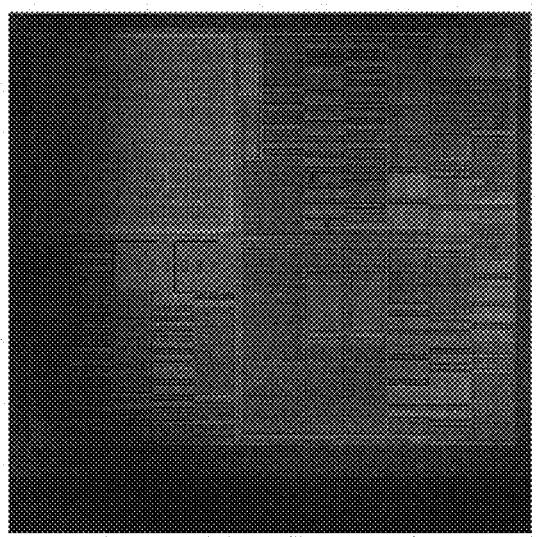
FIG. 9 is a microphotograph showing the result of FIB measurement of a semiconductor chip formed by the semiconductor device manufacturing method according to the embodiment of the present invention.

That is, when Low-K films are used as interlayer dielectric films, the problem of peeling cannot be avoided during TCT whether blade dicing or laser dicing is performed. However, by irradiating the cut surface with a laser after blade dicing as in the first and second embodiments described above, it is possible to fix the exposed surface of a Low-K film by melting the surface or changing the properties of the surface, and prevent peeling of the film as shown in FIG. 9. FIG. 9 shows the result of FIB (Focused Ion Beam) measurement when the cut surface was irradiated with a laser after blade dicing. As is evident by comparing FIG. 9 with FIG. 8, no white portion indicating peeling exists but patterns of the chip surface appear in FIG. 9.

The present invention is not limited to the first and second embodiments described above, and various modifications of the invention are possible.

[First Modification]

Figure 10:
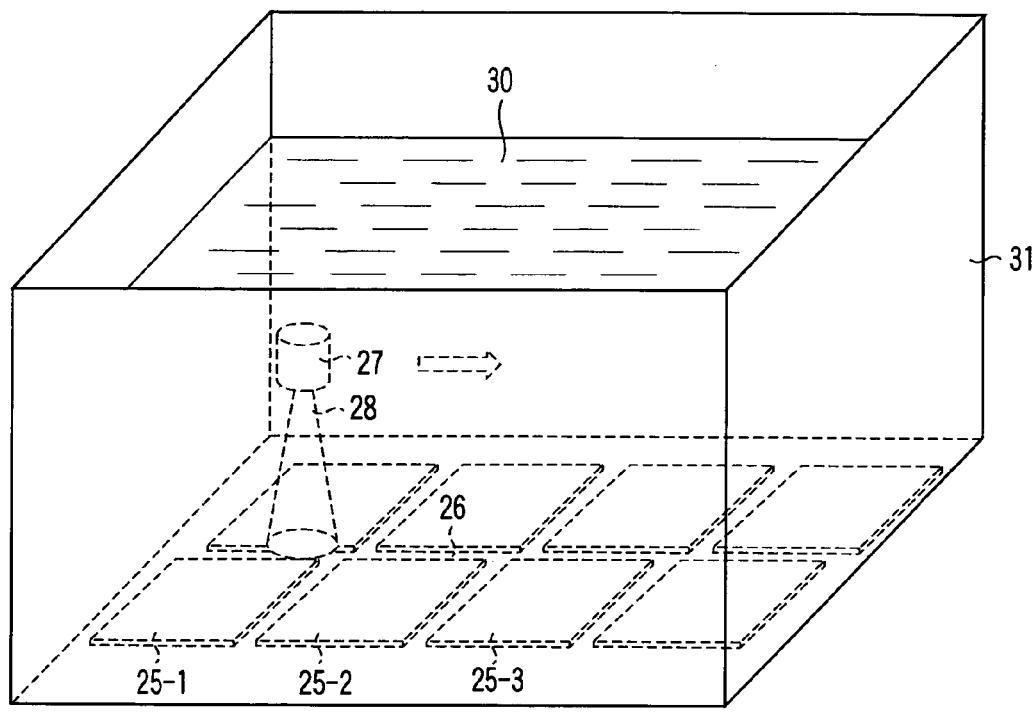
FIG. 10 is a perspective view, showing the interior of a processing bath, for explaining the first modification of the semiconductor device manufacturing methods and semiconductor device manufacturing apparatuses according to the first and second embodiments of the present invention.

As shown in FIG. 10, it is also possible to prepare a processing bath 31 filled with water 30, and process the surface of a dicing region 26 by irradiating it with a laser beam 28 while the semiconductor wafer is submerged in the water.

Since the laser beam 28 is emitted underwater, temperature control is easy, so the temperature rise of chips 25-1, 25-2, 25-3, . . . , caused by the emission of the laser beam 28 can be suppressed.

[Second Modification]

Figure 11:
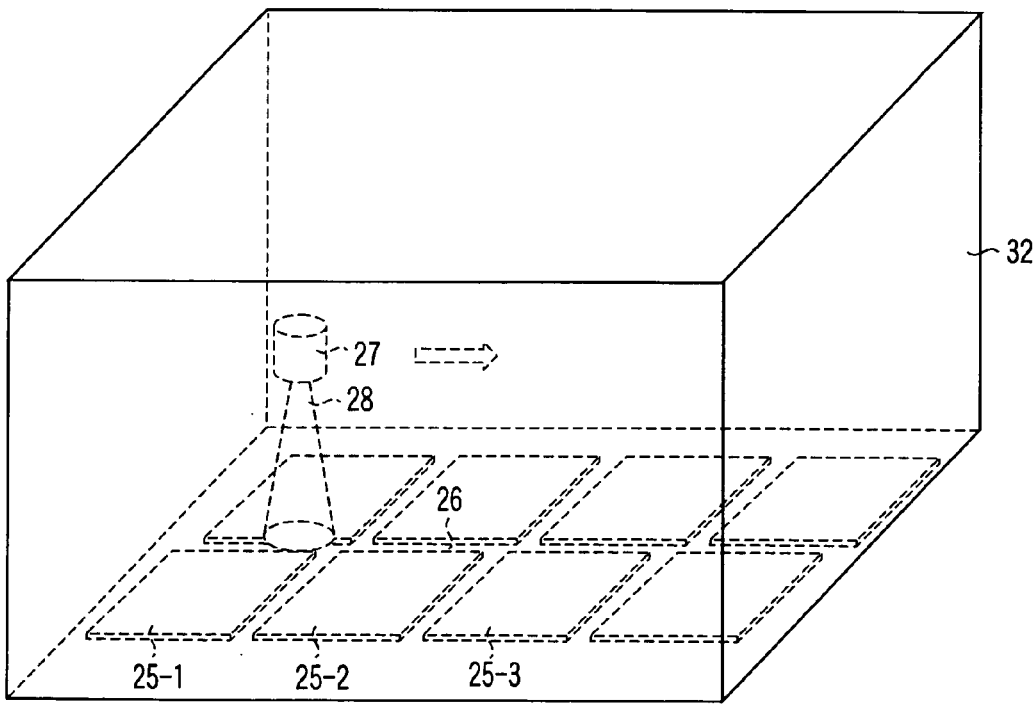
FIG. 11 is a perspective view, showing the interior of a vacuum chamber, for explaining the second modification of the semiconductor device manufacturing methods and semiconductor device manufacturing apparatuses according to the first and second embodiments of the present invention.

As shown in FIG. 11, it is also possible to prepare a vacuum chamber 32, and process the surface of a dicing region 26 by irradiating it with a laser beam 28 in a vacuum while the semiconductor wafer is placed in the vacuum chamber 32.

Since the laser beam 28 is emitted in a vacuum, it is possible to prevent easy adhesion of the vaporized material, and reduce contamination of chips 25-1, 25-2, 25-3, . . . .

[Third Modification]

Figure 12:
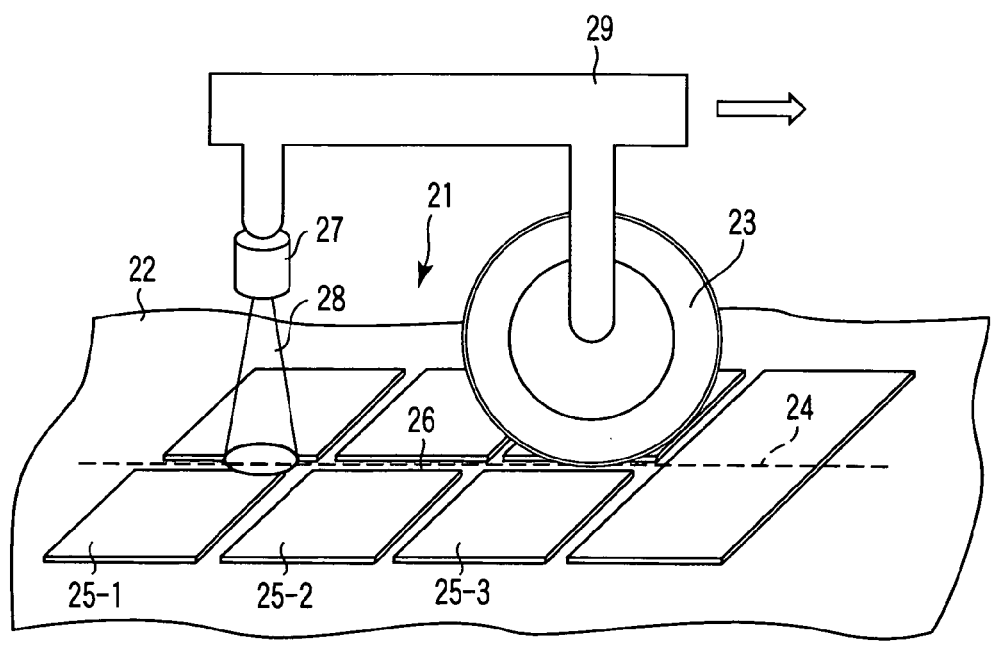
FIG. 12 is a perspective view, showing the main parts, for explaining the third modification of the semiconductor device manufacturing methods and semiconductor device manufacturing apparatuses according to the first and second embodiments of the present invention.

In the first and second embodiments, the dicing step and laser beam emission step are separate steps. However, as shown in FIG. 12, it is also possible to fix a diamond blade 23 and laser emitting apparatus 27 to a jig 29 beforehand such that the dicing direction of the diamond blade 23 and the irradiation position of a laser beam 28 emitted from the laser emitting apparatus 27 are centered. With this arrangement, a dicing region 26 can be irradiated with the laser beam 28 subsequently to dicing without aligning the dicing region 26 and the irradiation position of the laser beam 28.

This modification shown in FIG. 12 can be applied to both the first embodiment in which a semiconductor wafer is fully cut and the second embodiment in which a semiconductor wafer is half-cut.

As described above, according to one aspect of this invention, it is possible to obtain a semi-conductor device manufacturing method capable of suppressing a decrease in chip bending strength, and preventing cracking of semiconductor chips in the assembly steps or in the reliability test.

It is also possible to obtain a semiconductor device manufacturing apparatus capable of suppressing a decrease in chip bending strength caused by dicing.

Additional advantages and modifications will readily occur to those skilled in the art. Therefore, the invention in its broader aspects is not limited to the specific details and representative embodiments shown and described herein. Accordingly, various modifications may be made without departing from the spirit and scope of the general inventive concept as defined by the appended claims and their equivalents.

What is claimed is:

1. A method of manufacturing a semiconductor device comprising:

forming a semiconductor element in a semiconductor wafer;

forming a groove by performing half-cut dicing on the semiconductor wafer along a dicing line;

irradiating a dicing region of the semiconductor wafer with a laser beam to melt or vaporize a cutting streak formed by dicing;

adhering an adhesive tape to a semiconductor element formation surface of the semiconductor wafer; and grinding a backside of the semiconductor element formation surface to at least a depth reaching the groove.

2. A method according to claim 1, further comprising planarizing a back surface of a semiconductor chip by at least one of wet etching, plasma etching, polishing, buffing, and CMP, after the grinding.

3. A method according to claim 1, wherein the irradiation with the laser beam is performed underwater.

4. A method according to claim 1, wherein the irradiation with the laser beam is performed in a vacuum.

5. A method according to claim 1, wherein a wavelength of the laser beam is 266 to 1,064 nm.

6. A method according to claim 1, wherein an output of the laser beam is 0.8 to 4.5 W.

7. A method according to claim 1, wherein a moving velocity of an irradiation position of the laser beam is 1 to 400 mm/sec.

8. A method according to claim 1, wherein the semiconductor element in the semiconductor wafer comprises a low-dielectric-constant film, and the irradiation with the laser beam comprises melting or changing properties of the low-dielectric-constant film exposed to the dicing region.

9. A method of manufacturing a semiconductor device comprising:

forming a semiconductor element in a semiconductor wafer;

forming a groove by performing half-cut dicing on the semiconductor wafer along a dicing line;

adhering an adhesive tape to a semiconductor element formation surface of the semiconductor wafer;

grinding a backside of the semiconductor element formation surface to at least a depth reaching the groove; and irradiating a dicing region of a semiconductor chip, formed by dividing the semiconductor wafer in the grinding step, with a laser beam, thereby melting or vaporizing a cutting streak formed by dicing.

10. A method according to claim 9, further comprising planarizing a back surface of the semiconductor chip by at least one of wet etching, plasma etching, polishing, buffing, and CMP, after the grinding.

11. A method according to claim 9, wherein the irradiation with the laser beam is performed underwater.

12. A method according to claim 9, wherein the irradiation with the laser beam is performed in a vacuum.

13. A method according to claim 9, wherein a wavelength of the laser beam is 266 to 1,064 nm.

14. A method according to claim 9, wherein an output of the laser beam is 0.8 to 4.5 W.

15. A method according to claim 9, wherein a moving velocity of an irradiation position of the laser beam is 1 to 400 mm/sec.

16. A method according to claim 9, wherein the semiconductor element in the semiconductor wafer comprises a low-dielectric-constant film, and the irradiation with the laser beam comprises melting or changing properties of the low-dielectric-constant film exposed to the dicing region.

\* \* \* \* \*